United States Patent
Kelkar

(10) Patent No.: US 6,456,165 B1
(45) Date of Patent: Sep. 24, 2002

(54) PHASE ERROR CONTROL FOR PHASE-LOCKED LOOPS

(75) Inventor: Ram Kelkar, South Burlington, VT (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 09/642,508

(22) Filed: Aug. 18, 2000

(51) Int. Cl.[7] .......................... H03L 7/085; H03L 7/089
(52) U.S. Cl. ........................ 331/17; 331/1 A; 331/25; 327/156; 327/157; 327/159
(58) Field of Search .................. 331/1 A, 17, 25; 327/156–159

(56) References Cited

U.S. PATENT DOCUMENTS

| | | | |
|---|---|---|---|
| 4,562,411 A | * 12/1985 | O'Rourke et al. | 331/1 A |
| 4,987,387 A | 1/1991 | Kennedy et al. | |
| 5,208,546 A | 5/1993 | Nagaraj et al. | |
| 5,220,294 A | * 6/1993 | Ichikawa | 331/17 |
| 5,513,225 A | 4/1996 | Kelkar et al. | |
| 5,592,113 A | * 1/1997 | Quiet et al. | 327/158 |
| 5,629,651 A | * 5/1997 | Mizuno | 331/34 |
| 5,734,301 A | 3/1998 | Lee et al. | 331/2 |
| 5,740,213 A | 4/1998 | Dreyer | 375/374 |
| 5,774,023 A | 6/1998 | Irwin | 331/17 |
| 5,818,287 A | 10/1998 | Chow | |
| 5,821,789 A | 10/1998 | Lee | 327/157 |
| 5,821,818 A | 10/1998 | Idei et al. | 331/17 |
| 5,828,255 A | 10/1998 | Kelkar et al. | |
| 5,847,614 A | * 12/1998 | Gilbert et al. | 331/14 |
| 5,864,249 A | 1/1999 | Shoji | 327/156 |
| 5,870,003 A | 2/1999 | Boerstler | |
| 5,945,855 A | 8/1999 | Momtaz | |
| 6,011,822 A | 1/2000 | Dreyer | |
| 6,043,695 A | 3/2000 | O'Sullivan | |
| 6,043,716 A | 3/2000 | Warner | 331/17 |
| 6,075,394 A | 6/2000 | Shoji | 327/156 |
| 6,097,227 A | * 8/2000 | Hayashi | 327/158 |

* cited by examiner

Primary Examiner—David Mis
(74) Attorney, Agent, or Firm—Schmeiser, Olsen & Watts; Richard A. Henkler

(57) ABSTRACT

A phase-locked loop (PLL) device includes phase error control for allowing quick transitions from a first operating point to a second operating point when the phase error exceeds a user-defined threshold. Phase error control is accomplished by adding an additional charge pump and accompanying user-settable circuitry to the PLL device.

10 Claims, 3 Drawing Sheets

PHASE ERROR CONTROL FOR PHASE-LOCKED LOOPS

BACKGROUND OF THE INVENTION

1. Technical Field

The present invention relates generally to phase-locked loops and more specifically to phase error control circuitry for phase-locked loops.

2. Related Art

In general, a phase-locked loop (PLL) circuit is a circuit that produces an output signal that is synchronized with an input reference signal. The PLL output signal is synchronized with a reference signal when the frequency and phase of the output signal are the same as that of the reference signal. Should a deviation in the desired phase difference of such signals develop, the PLL will attempt to adjust the frequency and phase of its output signal to drive the phase error toward zero.

There are several different types of PLL devices. Among these are PLL devices that are based on charge pumps. In these PLL devices, a phase comparator compares an input reference signal to an output signal from a voltage controlled oscillator for the purpose of observing phase and frequency differences between the signals. If differences are observed, the phase comparator produces logic pulses indicative of such differences. The charge pump receives these logic pulses and, based thereon, provides pulses of current to a loop filter and to a voltage-controlled, or current-controlled oscillator. As filtered, these current pulses serve to adjust the voltage/current-controlled oscillator to compensate for the observed differences.

Because traditional PLL devices normally use charge pumps with gains optimized for steady state performance parameters such as jitter, a problem may occur if the operating point of the PLL is changed. That is, when one output frequency value is changed to another output frequency value, it takes some time for the circuit to reduce and eliminate the phase error.

Accordingly, a need has developed in the art for a PLL device that will improve the settling time of the device for changes in operating points without producing much overhead in the device.

SUMMARY OF THE INVENTION

The present invention provides a phase-locked loop (PLL) device and system that allows for a quick transition from a first operating point to a second operating point when the phase error exceeds a user-defined threshold. This phase error control is accomplished by adding an additional charge pump and accompanying user-settable circuitry to the PLL device.

Generally, the present invention provides a phase-locked loop device comprising:
   a main charge pump;
   an auxiliary charge pump; and
   a phase error control charge pump that is only active when a phase error of said PLL device exceeds a user-defined value.

In addition, the present invention provides a method for a PLL device to quickly change operating points comprising:
   a) providing a phase error control charge pump; and
   b) activating said phase error control charge pump only when a phase error of said PLL device exceeds a user-defined value.

The present invention also provides a phase-locked loop system having a PLL device comprising:
   a phase comparator, for comparing an input signal with an output signal of said PLL device and determining said phase error with said comparison;
   a main charge pump, coupled to said phase comparator;
   an auxiliary charge pump, coupled to said phase comparator;
   a phase error control charge pump, coupled to said phase comparator, said phase error control charge pump being active only when a phase error of said PLL device exceeds a user-defined value;
   an oscillator, coupled to said main charge pump, said auxiliary charge pump and said phase error control charge pump, for outputting said output signal; and
   a lock indicator, coupled to said input signal, for indicating when said PLL system is in phase.

The foregoing and other features of the invention will be apparent from the following more particular description of embodiments of the invention, as illustrated in the accompanying drawings.

BRIEF DESCRIPTION OF THE DRAWINGS

Embodiments of the present invention will hereinafter be described in conjunction with the appended drawings, where like designations denote like elements, and wherein.

DETAILED DESCRIPTION OF THE DRAWINGS

Figure 1:
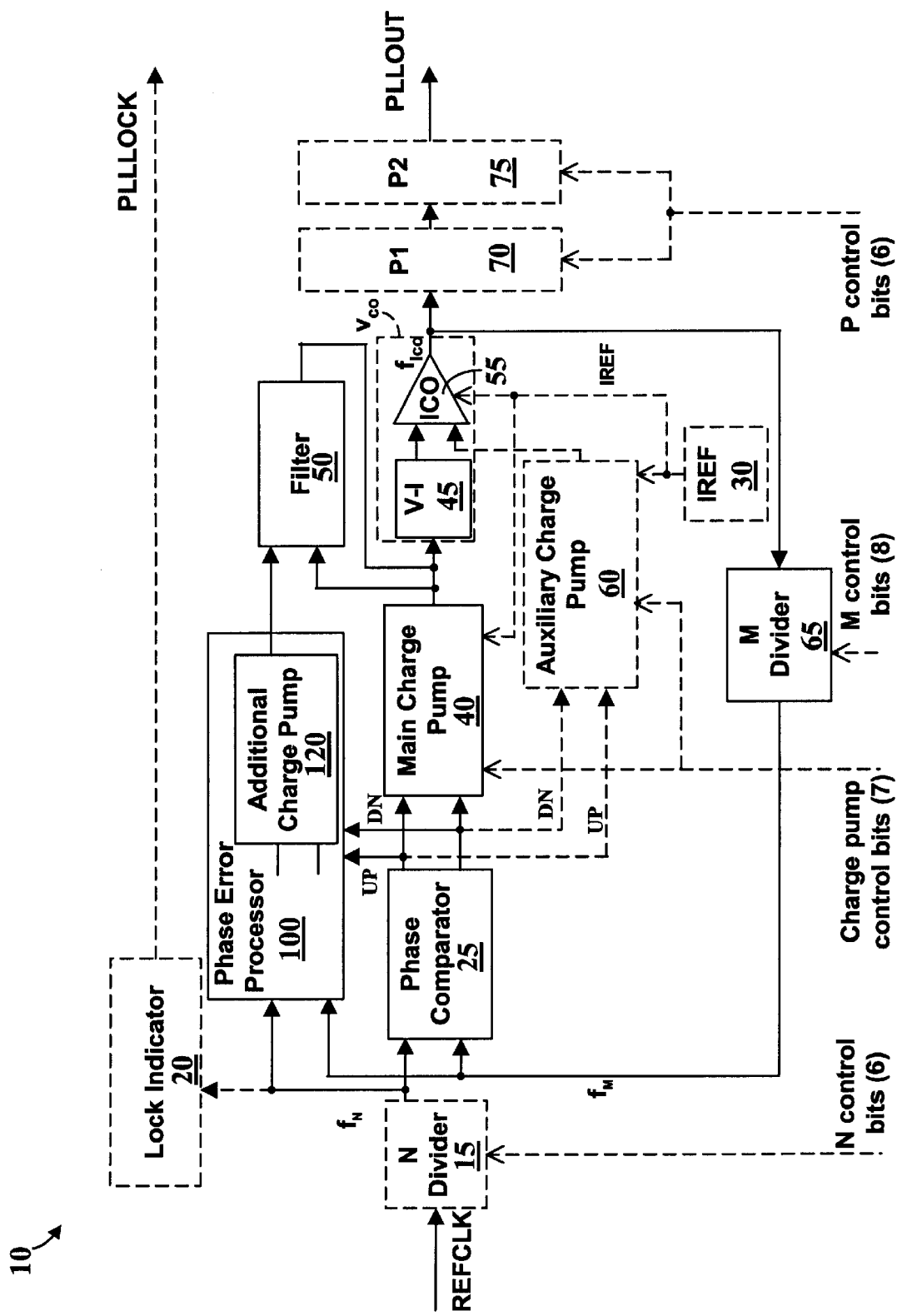
FIG. 1 is a block diagram of a phase-locked loop device in accordance with an embodiment of the present invention.

FIG. 1 illustrates a block diagram of a phase-locked loop (PLL) device 10 having dividers 15, 65, 70 and 75, lock indicator 20, phase comparator 25, current reference (IREF) 30, main charge pump 40, auxiliary charge pump 60, phase error processor 100, filter 50, voltage to current (V-I) converter 45, and current-controlled oscillator (ICO) 55 in accordance with an embodiment of the present invention.

N divider 15, which is a programmable frequency divider, receives reference clock signal (REFCLK) and N control bits for dividing REFCLK (in this example, there are 6 control bits to divide REFCLK between 1 and 64). M divider 65 is a programmable frequency divider that receives the output of ICO 55 and M control bits for dividing the ICO output clock ($f_{ICO}$) (in this example, there are 8 control bits to divide $f_{ICO}$ between 3 and 160). The forward path of PLL 10 comprises all the previously described elements with the exception of the M divider 65, which belongs to the feedback path of PLL 10. The use of programmable dividers in the forward and feedback paths results in a PLL that can synthesize many frequencies from a single input clock (e.g., REFCLK).

The divided clocks from M divider 65 ($f_M$) and N divider 15 ($f_N$) are inputted into phase comparator 25, and phase error processor 100. Phase comparator 25 outputs UP and DN, which are pulses whose widths indicate the phase error between $f_M$ and $f_N$. UP and DN are inputted into phase error processor 100, main charge pump 40, and auxiliary charge pump 60. Charge pumps 40 and 60 also receive charge pump control bits and the current reference IREF from IREF 30. Filter 50, which is an internal filter, receives pulses from phase error processor 100 and main charge pump 40. Filter 50 is coupled to V-I converter 45. ICO 55 receives the output of V-I converter 45, the output of auxiliary charge pump 60, and IREF 30, and outputs $f_{ICO}$, which is divided by P1 and P2, which are symmetrical programmable frequency dividers 70 and 75, to create the output clock signal of PLL 10 (PLLOUT). In this example, P1 and P2 have 6 control bits to divide $f_{ICO}$. Lock indicator 20 receives $f_N$ from N divider 15 and outputs PLLLOCK.

In operation, the phase of the divided-down input frequency $f_N$ is compared to the phase of the divided-down ICO output frequency $f_M$ through phase comparator 25. That is, phase comparator 25 outputs UP and DN, which are pulses whose widths indicate the phase error between $f_M$ and $f_N$.

The main charge pump 40 processes these UP and DN pulses by multiplying the signals by a gain factor and then applying the signals appropriately to two capacitors (not shown) that make up the internal filter 50. For example, if UP is wider than DN, more charge is withdrawn from the capacitor at the negative node of the filter 50 to make the differential voltage across the filter increase. The auxiliary charge pump 60 provides extra stability for the system and is discussed, along with the main charge pump and other features, in greater detail in U.S. Pat. No. 5,513,225, "Resistorless Phase Locked Loop Circuit Employing Direct Current Injection", issued April 1996 to Kelkar et al., incorporated herein by reference.

The voltage outputted from filter 50 and main charge pump 40 is then converted to current through V-I converter 45 and this current, along with the output of auxiliary charge pump 60, enters into ICO 55.

The clock frequency $f_{ICO}$, is then outputted from ICO 55 and fed back into the PLL circuit 10 through M divider 65. Lock indicator 20 outputs PLLLOCK in phase with REFCLK. PLLOUT is outputted from PLL device 10 through P1 and P2.

Thus, normal operation proceeds with the normally used charge pumps with gains optimized for steady state performance parameters such as jitter.

Phase error processor 100 is used only when the frequency of PLL circuit 10 is varied such that the phase error exceeds a user-defined threshold. That is, in certain applications, PLL circuit 10 may need to transition from one output frequency value to another. As will be seen in FIG. 2, phase error processor comprises an additional charge pump with elements that allow the charge pump to be used only when the phase error exceeds a user-settable threshold. Thus, phase error processor 100 may be included in any existing PLL system without affecting the overhead in normal steady state performance parameters, but when needed, may be used to quickly transition the PLL system from one output frequency value to another.

Figure 2:
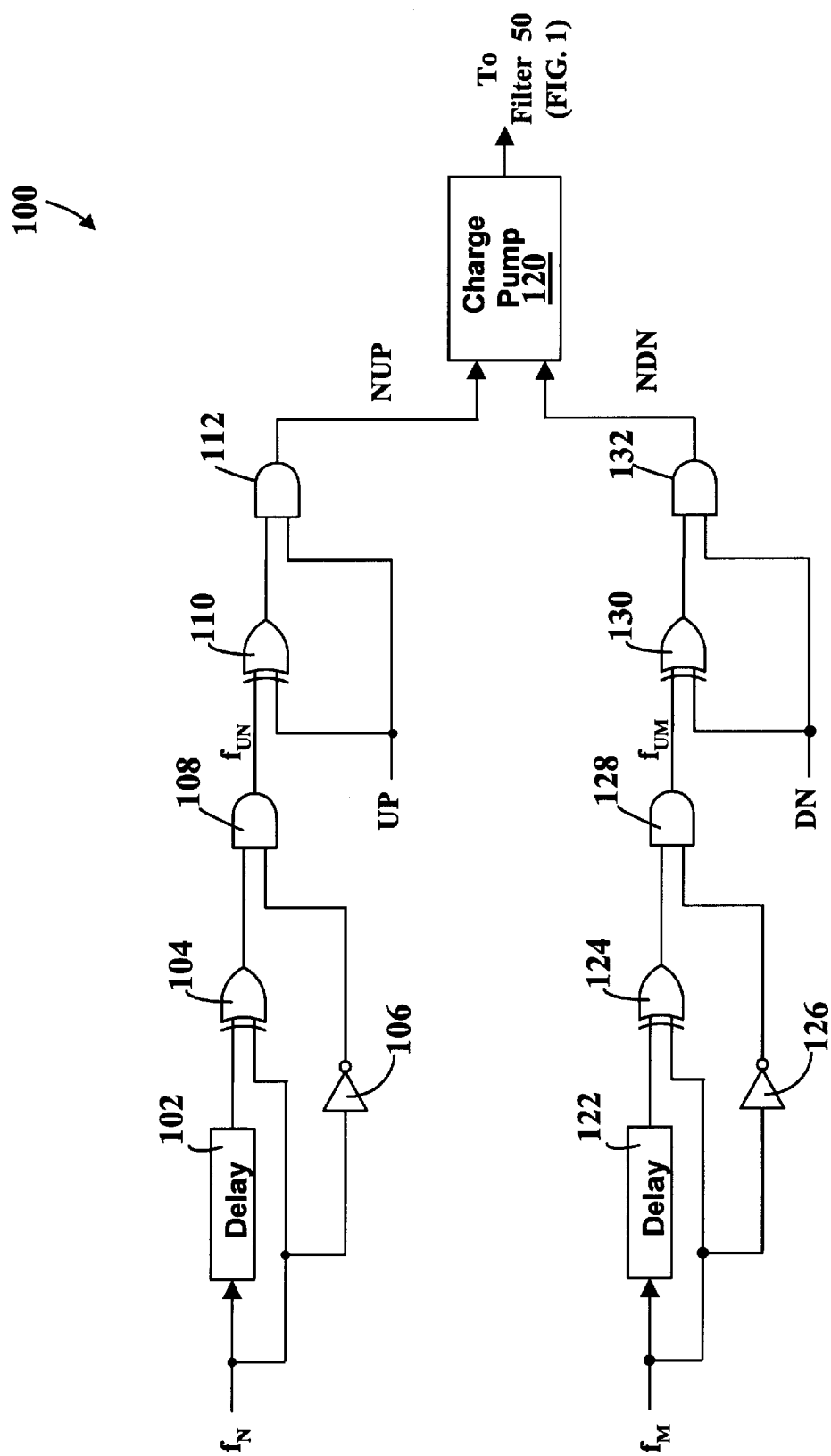
FIG. 2 is a block circuit diagram of the phase error processor of FIG. 1.

In FIG. 2, an exemplary phase error processor 100 including a charge pump 120 and user-definable elements 102–112 and 122–132 is shown. Specifically, for this example, phase error processor 100 comprises delay circuits 102 and 122, XOR gates 104, 110, 124, and 130, inverters 106 and 126, AND gates 108, 112, 128, and 132, and charge pump 120. Although these specific elements are shown as an example for phase error processor 100, other appropriate elements may be used to allow for user-defined thresholds for charge pump 120. Furthermore, phase error processor 100 may also include elements to be user-selectable.

Delay 102 receives $f_N$ from N divider 15. The output of delay 102 and $f_N$ are inputted in XOR gate 104. $f_N$ is also inputted into inverter 106. The output of XOR gate 104 and inverter 106 are inputted into AND gate 108. XOR gate 110 receives the output of AND gate 108 and pulse signal UP. AND gate 112 receives the output of XOR gate 110 and pulse signal UP and outputs signal NUP.

Similarly, delay 122 receives $f_M$ from M divider 65. The output of delay 122 and $f_M$ are inputted into XOR gate 124. $f_M$ is also inputted into inverter 126. The output of XOR gate 124 and inverter 126 are inputted into AND gate 128. XOR gate 130 receives the output of AND gate 128 and pulse signal DN. AND gate 132 receives the output of XOR gate 130 and pulse signal DN and outputs signal NDN.

Both NUP and NDN are inputted into charge pump 120, which is coupled to filter 50.

Figure 3:
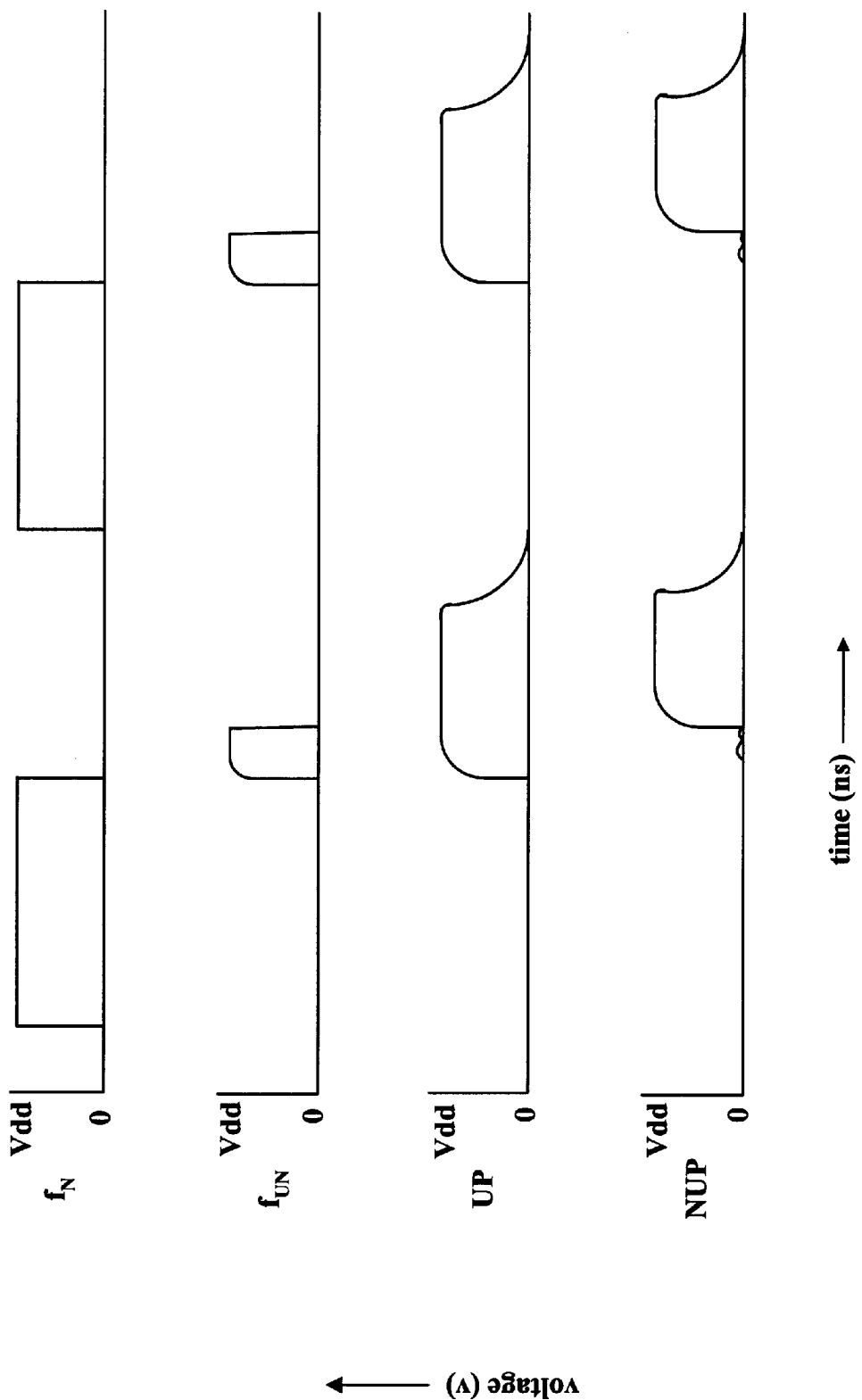
FIG. 3 graphically show voltage waveforms vs. time associated with the signals of FIG. 2.

In operation, as seen in FIG. 3, $f_N$ is used to create the user-defined pulse $f_{UN}$. The pulse width of $f_{UN}$, is created through elements 102, 104, 106 and 108, which are user-settable. $f_{UN}$ is positioned such that its rising edge corresponds with the falling edge of $f_N$. $f_{UN}$ is used along with UP to create the pulse NUP, whose width equals the difference between the UP and $f_{UN}$ pulse widths. Thus, the width of NUP is the excess amount of phase error encoded in the UP signal.

User-defined pulse $f_{UM}$ is created from $f_M$ in a similar manner. The pulse width of fUN is created through elements 122, 124, 126 and 128, which are user-settable. $f_{UM}$ is positioned such that its rising edge corresponds with the falling edge of $f_M$. $f_{UM}$ is used along with DN to create the pulse NDN, whose width equals the difference between the DN and $f_{UM}$ pulse widths. Thus, the width of NDN is the excess amount of phase error encoded in the DN signal.

Elements 102–108 and 122–128 are thus filters that are used along with elements 110, 112, 130 and 132 to remove a user-determined amount of phase error from the UP and DN signals.

NUP and NDN are used similar to UP and DN; wherein NUP with charge pump 120 will remove charge from the capacitor (not shown) at the negative node in filter 50, and NDN will remove charge from the capacitor at the positive node in filter 50.

Thus, this invention provides a phase-locked loop device and system that allows for a quick transition from a first operating point to a second operating point (one output frequency value to another) when the phase error exceeds a user-defined threshold. This is accomplished by adding an additional charge pump and circuitry to the PLL device, which, when needed, aids in the removal of the user-determined amount of phase error from the UP and DN pulses. When the additional charge pump is not needed, that is, the phase error does not exceed a user-defined threshold, then power is not consumed by the charge pump and thus, overall power is reduced in the PLL device. Furthermore, changing an existing PLL system to include the phase error processor of the present invention is not only practical, but inexpensive.

While the invention has been particularly shown and described with reference to a specific embodiment thereof, it will be understood by those skilled in the art that the foregoing and other changes in form and details may be made therein without departing from the spirit and scope of the invention.

What is claimed is:

1. A phase-locked loop (PLL) device comprising:
   a main charge pump,;
   a phase error control charge pump that is only active when a phase error of said PLL device exceeds a user-defined value;

a user-defined circuit coupled to said phase error control charge pump for determining a phase error of said PLL device and activating said phase error control charge pump when said phase error exceeds said user-defined value;

a phase comparator, coupled to said main charge pump, said auxiliary charge pump, and said user-defined circuit, for providing a fist and second pulse, wherein said phase error is determined based on said first and second pulse;

a filter, coupled to said phase error control charge pump and said main charge pump, said phase error control charge pump removing charge from said filter only when said phase error exceeds a user-defined value; and an oscillator, coupled to said filter and said auxiliary charge pump, for outputting an output signal;

wherein said user-defined circuit receives an input signal of said PLL circuit and said output signal from said oscillator for creating user-settable pulse width, wherein said user-defined circuit includes:
   a first delay circuit, coupled to said input signal;
   a second delay circuit, coupled to said output signal;
   a first XOR gate, coupled to said first delay circuit and receiving said first pulse from said phase comparator;
   a second XOR gate, coupled to said second delay circuit and receiving said second pulse from said phase comparator;
   a first AND gate, coupled to said first XOR gate and receiving said fist pulse; and
   a second AND gate, coupled to said second XOR gate and receiving said second pulse;
   wherein outputs of said first and second AND gate are inputted into said phase error control charge pump.

2. A phase-locked loop (PLL) system having a PLL device, comprising:

a phase comparator, for comparing an input signal with an output signal of said PLL device and determining said phase error with said comparison;

a main charge pump, coupled to said phase comparator;

a phase error control charge pump, coupled to said phase comparator, said phase error control charge pump being active only when a phase error of said PLL device exceeds a user-defined value;

an oscillator, coupled to said main charge pump and said phase error control charge pump, for outputting said output signal;

a filter, coupled to said main charge pump and said phase error control charge pump; and a user-defined circuit coupled to said phase error control charge pump for determining a phase error of said PLL device and activating said phase error control charge pump when said phase error exceeds said user-defined value, wherein said user-defined circuit receives an input signal of said PLL circuit and said output signal from said oscillator for creating a user-settable pulse width, and wherein said user-defined circuit includes:
   a first delay circuit, coupled to said input signal;
   a second delay circuit, coupled to said output signal;
   a first XOR gate, coupled to said first delay circuit and receiving said first pulse from said phase comparator;
   a second XOR gate, coupled to said second delay circuit and receiving said second pulse from said phase comparator;
   a first AND gate, coupled to said first XOR gate and receiving said first pulse; and
   a second AND gate, coupled to said second XOR gate and receiving said second pulse;
   wherein outputs of ad first and second AND gate are inputted into said phase error control charge pump.

3. A phase-locked loop (PLL) device comprising:

a main charge pump conductively connected to a filter;

an additional charge pump conductively connected to the filter, wherein the additional charge pump is active because and only when a phase error exceeds a user-defined value;

a user-defined circuit coupled to said additional charge pump for activating said additional charge pump because and when said phase error exceeds said user-defined value; and a phase comparator, adapted to provide one of a first and second pulse to the main charge pump and to the user-defined circuit, wherein said fist and second pulses are proportional to said phase error, and further wherein said user-defined circuit receives an input signal ($f_N$) and said output signal ($f_M$) from said oscillator for creating either a first signal (NUP) or a second signal (NDN), wherein the first signal UP) is active because and when the phase error is positive and the magnitude of the phase error is greater than the user-defied value, and wherein the second signal (NDN) is active because and when We phase error is negative and the magnitude of the phase error is greater than the user-defined value.

4. The device of claim 3 wherein said first signal (NUP) and the second signal (NDN) are input to the additional charge pup and are adapted to activate the additional charge pump because and when the magnitude of the phase error exceeds the user-defined value.

5. A phase-locked loop (PLL) device comprising:

a main charge pump for adding or removing charge from a filter;

an additional charge pump for adding or removing charge from the filter, wherein the additional charge pump is only activated when a phase error in said PLL device exceeds a user-defined value;

a filter being connected to said main charge pump and to said additional charge pump;

an oscillator coupled to said filter for outputting an output signal;

a phase comparator, coupled to said main charge pump, for providing either a first pulse or a second pulse based upon said phase error; and a user-defined circuit coupled to said additional charge pump for activating said additional charge pump when said phase error exceeds said user-defined value, wherein said user-defined circuit receives an input signal and said output signal, and wherein said user-defined circuit includes:
   a first delay circuit, coupled to said input signal;
   a second delay circuit, coupled to said output signal;
   a first XOR gate, coupled to said first delay circuit and receiving said first pulse from said phase comparator;
   a second XOR gate, coupled to said second delay circuit and receiving said second pulse from said phase comparator,
   a first AND gate, coupled to said first XOR gate and receiving said first pulse; and
   a second AND gate, coupled to said second XOR gate and receiving said second pulse;

wherein outputs of said first and second AND gates are inputted into said additional charge pump to activate said additional charge pump.

6. The device of claim 5 wherein first delay circuit comprises:
   a first delay element receiving said input signal;
   a fist delay XOR gate, coupled to said first delay element and receiving said input signal;
   a first inverter, receiving said input signal; and
   a fist delay AND gate, coupled to said first delay XOR gate and said first inverter.

7. The device of claim 5, wherein second delay circuit comprises:
   a second delay element receiving said output signal;
   a second delay XOR gate, coupled to said second delay element and receiving said input signal;
   a second inverter, receiving said input signal; and
   a second delay AND gate, coupled to said second delay XOR gate and said second inverter.

8. A phase-locked loop (PLL) system having a PLL device, the system comprising:
   a main charge pump, coupled to a phase comparator;
   an additional charge pump, coupled to said phase comparator, said additional charge pump being active only when a phase error in said PLL device exceeds a user-defined value;
   an oscillator, coupled to said main charge pump and to said additional charge pump, for outputting an output signal;
   a phase comparator, for determining said phase error by comparing an input signal with the output signal;
   a filter, coupled to said main charge pump and to said additional charge pump; and
   a user-defined circuit coupled to said phase error control charge pump for activating said phase error control charge pump when said phase error exceeds said user-defined value, wherein said user-defined circuit receives an input signal of said PLL circuit and said output signal form said oscillator, and wherein said user-defined circuit includes:
   a first delay circuit, coupled to said input signal;
   a second delay circuit, coupled to said output signal;
   a first XOR gate, coupled to said first delay circuit and receiving said first pulse from said phase comparator;
   a second XOR gate, coupled to said second delay circuit and receiving said second pulse from said phase comparator;
   a first AND gate, coupled to said first XOR gate and receiving said first pulse; and
   a second AND gate, coupled to said second XOR gate and receiving said second pulse;
   wherein outputs of said first and second AND gate as inputted into said phase error control charge pump.

9. The system of claim 8, wherein first delay circuit comprises:
   a first delay element receiving said input signal;
   a first delay XOR gate, coupled to said first delay clement and receiving said input signal;
   a first inverter receiving said input signal and
   a first delay AND gate, coupled said first delay XOR gate and said first inverter.

10. The system of claim 8, wherein second delay circuit comprises:
    a second delay element receiving said input signal;
    a second delay XOR gate, coupled to said second delay element and receiving said input signal;
    a second inverter, receiving said input signal; and
    a second delay AND gate, coupled to said second delay XOR gate and said second inverter.

* * * * *